United States Patent [19]

Terakawa et al.

[11] 4,366,503
[45] Dec. 28, 1982

[54] SOLID STATE IMAGE PICK-UP DEVICE AND ITS CHARGE TRANSFER METHOD

[75] Inventors: Sumio Terakawa, Ibaraki; Tohru Takamura, Takatsuki; Kenju Horii, Otsu; Takahiro Yamada, Katano, all of Japan

[73] Assignees: Matsushita Electronics Corp.; Matsushita Electric Industrial Co., Ltd., both of Osaka, Japan

[21] Appl. No.: 197,026

[22] Filed: Oct. 15, 1980

[30] Foreign Application Priority Data

Oct. 19, 1979 [JP] Japan ................................. 54-135590

[51] Int. Cl.³ ............................................. H04N 3/14
[52] U.S. Cl. ............................................. 358/213
[58] Field of Search ................................. 358/213

[56] References Cited

U.S. PATENT DOCUMENTS 4,155,006  4/1979  Sato et al. ........................... 358/213
4,188,642  2/1980  Morishita et al. .................... 358/213

Primary Examiner—Richard Murray
Attorney, Agent, or Firm—Stevens, Davis, Miller & Mosher

[57] ABSTRACT

A solid-state image pick-up device has transfer gates and storage capacitive elements with smaller capacitance than that of a vertical transfer lines between the vertical transfer lines to which signal charge is transferred through the operation of a signal charge transfer circuit containing the vertical shift register and switch elements, and a horizontal shift register for receiving the signal charge. The horizontal shift register is of the charge coupling type. The horizontal shift register has unit elements two times the vertical transfer lines. An optical signal and the other charge than the optical signal charge are stored in the adjacent unit elements and then the other charge than the optical charge is outputted to the other portion than a signal output portion.

A charge transfer method for the solid state image pickup device comprises a first step of injecting bias charge from the storage capacitive elements to the vertical transfer lines, a second step for transferring a changed amount of the charge on the vertical transfer line and the bias charge to the storage capacitive element and a third step for transferring only the changed amount of the charge to the horizontal shift register.

10 Claims, 9 Drawing Figures

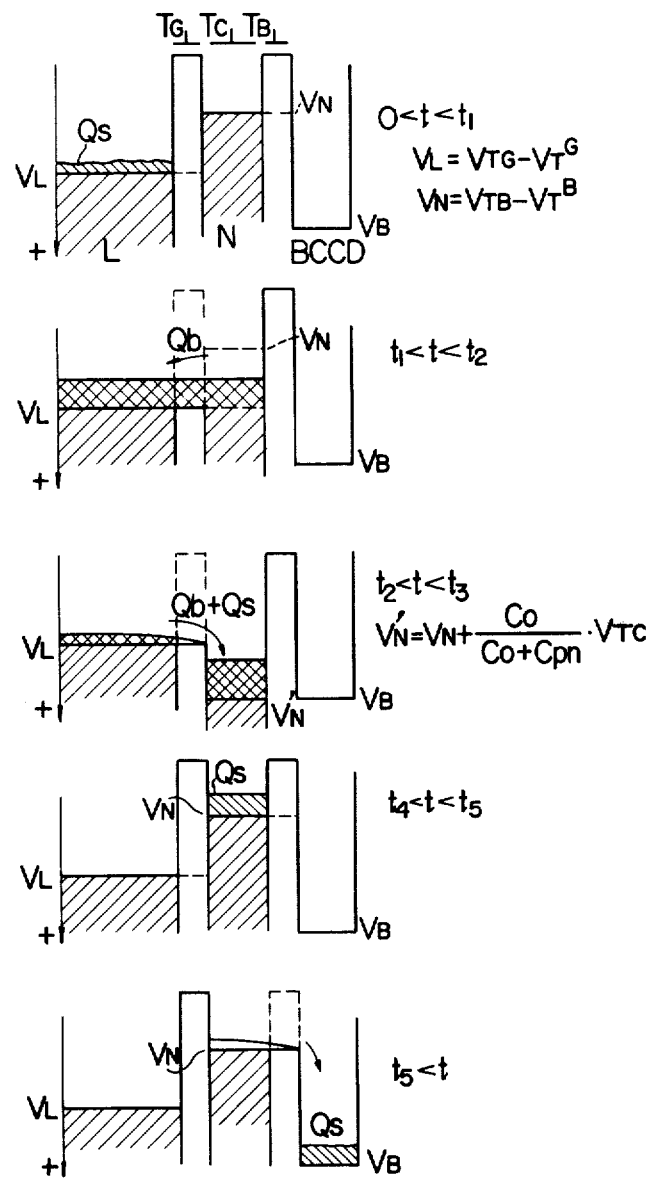

SOLID STATE IMAGE PICK-UP DEVICE AND ITS CHARGE TRANSFER METHOD

BACKGROUND OF THE INVENTION

The present invention relates to a solid-state image pick-up device with high resolution, high S/N ratio, and good blooming resistivity and its charge transfer method.

The present invention has an object to provide a solid-state image pick-up device effective for repititive transfer operations in which when an amount of charge stored in a given capacitor slightly changes through the charge and discharge operation, only the changed amount of the charge is transferred to a capacitance with much smaller capacity than that of the former capacitor, at higher speed and good efficiency.

The present invention has another object to provide a charge transfer method for the above-mentioned solid-state image pick-up device.

One of the essential requirements required for a solid-state image pick-up device is a high resolution which requires a sufficiently increased number of picture elements. To this end, MOSLSI technology is employed, which is relatively easy to obtain in a high-density integrating fabrication and enables the imaging section, the shift register section and the junctions therebetween to be integrated into a discrete circuit.

BRIEF DESCRIPTION OF THE DRAWINGS

FIG. 4b shows a sequence of potential diagrams of operation modes at respective times in FIG. 4a.

DETAILED DESCRIPTION OF THE PREFERRED EMBODIMENTS

Figure 1:
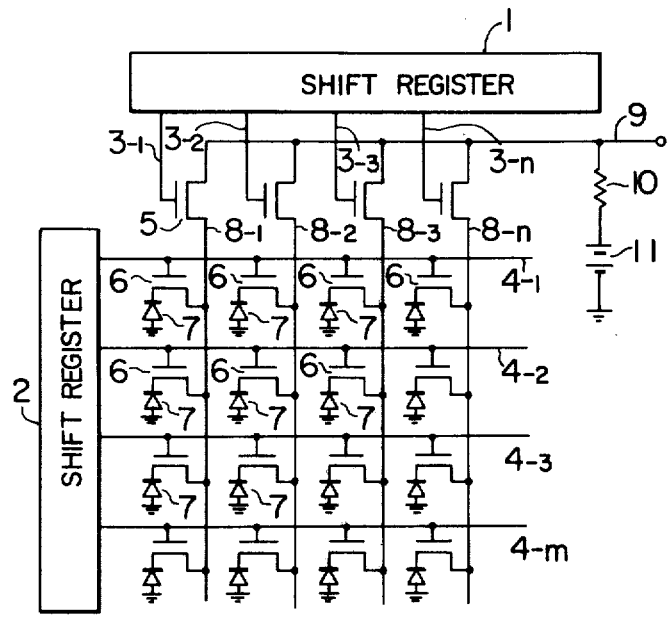
FIG. 1 shows a circuit diagram for illustrating the principle of a conventional MOS type two-dimensional solid-state image pick-up device.

The solid-state image pick-up device is generally classified into a MOS type solid-state image pick-up device and a CCD type solid-state image pick-up device. FIG. 1 is a schematic circuit arrangement of the MOS type solid-state image pick-up device. In the figure, reference numeral 1 designates a MOS type shift register for the horizontal scanning and reference numeral 2 represents a MOS type shift register for the vertical scanning. These shift registers 1 and 2 are driven by usual 2-phase clock pulses. Those shift register shift start pulses at fixed timings of clock pulses to provide shift pulses. Those shift pulses are outputted into scanning pulse input lines 3-1, 3-2, ... 3-n, and 4-1, 4-2, ... 4-m, respectively. In response to those pulse trains, the horizontal MOS switches 5 and the vertical MOS switches 6 are sequentially switched, so that signals derived from photodiodes 7 using the diffusion layers of the source region of the vertical MOS switch 6 are delived into a video output line 9, via vertical transfer lines 8-1, 8-2, ... 8-n. The video signal taken out into the video output line 9 represents the charge current when the diode, which had been discharged by the incident light during one frame, is charged by a video power-source 11, and is read out through a load resistor 10.

Figure 2:
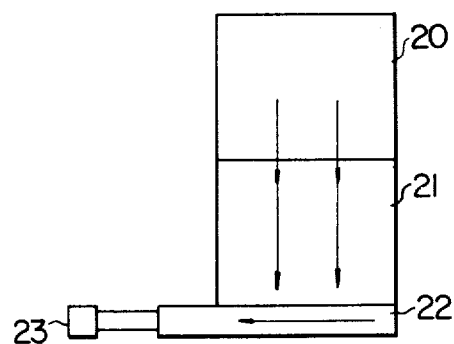
FIG. 2 shows a schematic diagram for illustrating the principle of the two-dimensional solid-state image pick-up device of the CCD frame transfer type.

FIG. 2 illustrates a principle construction of a frame transfer type solid-state image pick-up device which is an example of the CCD type solid-state image pick-up device. Reference numeral 20 denotes an optoelectric converting section for storing optical signal charge which normally uses a surface channel type charge coupled device. The optical signal charge optoelectric converted by optoelectric converting section 20 is quickly frame-transferred to an optical signal charge storage section 21 disposed adjacent thereto during a vertical flyback period. The optical signal charge storage section 21 usually also uses a surface channel type charge coupled device. The optical signal charge transferred to the optical signal charge storage section 21 is transferred to a horizontal shift register 22 which normally uses a buried channel charge coupled device during the horizontal flyback period, and is further transferred toward a signal output section 23 by using a proper transfer clock signal and then is read out.

In the MOS type solid-state image pick-up device, each picture element is separately formed by a pn junction. For this reason, the signal separation among the respective picture elements is extremely good. The horizontal scanning pulse derived from the MOS type horizontal shift register goes through the gate capacitance of the horizontal MOS transistor and a stray capacitance between the gate and drain thereof and appears as spike noise on the video output line. A variation in above-mentioned capacitance, which is the main factor to cause a called fixed pattern noise, greatly reduces the S/N ratio of the video signal. This is the most serious problem inherent to the MOS type solid-state image pick-up device.

In the case of the CCD frame transfer solid-state image pick-up device having picture elements arranged in m-row and n-column, the buried channel charge coupled device is used for the horizontal scanning shift register. For this reason, the fixed pattern noise is extremely small and the S/N ratio is good. The image pick-up device of this type has a basic operation that the signal charge derived from the optoelectric converting section is once transferred to the optical signal storage section and then the signal charge stored in the section is sequentially transferred to the horizontal shift register. The basic operation has an unavoidable transfer loss caused when the signal charge is transferred through m stages or more. A degree of deterioration of the signal transferred changes depending on the distance of each picture element relative to the horizontal scanning shift register. As a result, a degree of deterioration of the picture quality varies with respect to locations on the screen. As described above, neither the MOS type solid-state image pick-up device nor the CCD type solid-state image pick-up device has successfully provided high resolution and good S/N ratio.

Accordingly, an object of the present invention is to provide a solid-state image pick-up device with high resolution, high S/N ratio and good blooming-resistivity.

Figure 3:
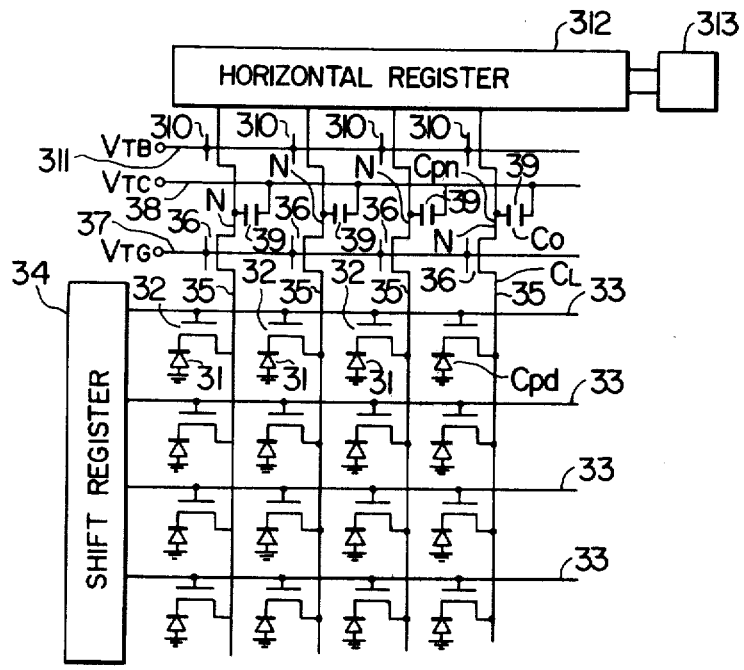
FIG. 3 shows a circuit diagram of an embodiment of the two-dimensional solid-state image pick-up device according to the present invention.

Referring to FIG. 3, there is shown a circuit arrangement of a two dimensional solid-state image pick-up device according to one embodiment of the present invention. As shown, picture elements each including a photodiode 31 and a vertical MOS switch 32 are arranged in a matrix fashion. In FIG. 3, a matrix of 4 rows and 4 columns is illustrated for simplicity. A number of vertical MOS switches 32 are commonly connected at the gates to form a vertical scanning pulse input line 33 connected to a MOS type vertical shift register 34. The drains of the vertical MOS switches 32 at each row are commonly connected to form a vertical transfer line 35. The vertical transfer lines 35, respectively, are connected at one ends to transfer MOS transistors 36 with first transfer gates, via the source portions thereof. The gates of the MOS transistors 36 are connected to one another thereby to form a first gate input line 37. The drain portion of each of the transfer MOS transistors 36 is connected to the other end of each of storage capacitor elements 39 made of MOS capacitors which are commonly connected at one ends thereby to form a storage gate input line 38, so that storage sections N are formed. The second transfer gates 310 are arranged adjacent to the storage capacitor 39, respectively. Those transfer gates are commonly connected to form a second gate input line 311. A buried channel charge coupling type horizontal register 312 (referred to as a horizontal register) disposed adjacent to the transfer gates 310 is connected to at one end to a signal output section 313. In the description to follow, all the MOS switches are of the N channel enhancement type; however, the same operation principle is correspondingly applicable for the other types of the MOS switches. On the basis of the basic operation of the image pick-up device referred to with relation to FIGS. 1 and 2, the description will proceed placing an emphasis on the operations essential to the present invention.

The operation principle of the present invention will be described. Firstly, by applying a vertical scanning pulse to the vertical MOS switch 32 during one-horizontal flyback period thereby to turn on the same switch 32, the signal charge stored in the photodiodes 31 is transferred to the corresponding transfer lines 35. Then, by applying proper transfer pulses to the pulse input lines 37 and 38, the signal charges on the transfer lines 35 are effectively transferred to and temporarily stored in the drain portions N (storage portions) of the MOS transistors 36. In the next step, by applying the transfer pulse to the pulse input line 311, the signal charge stored in the storage portion N is transferred to the horizontal shift register 312. The signal charge is shifted through the horizontal shift register 312 in synchronism with proper transfer clock pulses and is read out by the signal output section 313.

Figure 4A:
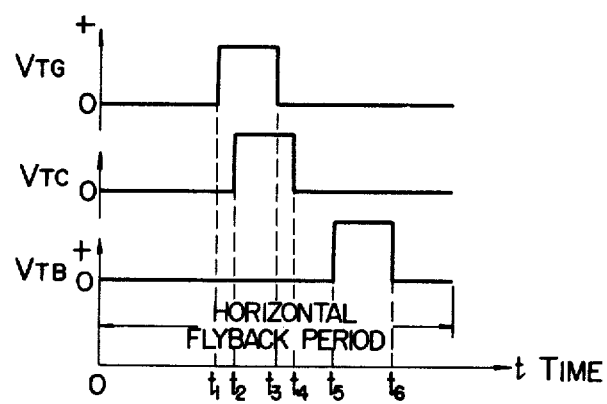
FIG. 4a shows voltage waveforms at the respective portions of the circuit shown in FIG. 3 when that circuit is driven.

In FIG. 4a, there are illustrated, by way of example, a set of timing diagrams for executing the above-mentioned operation of the solid-stage image pick-up device according to the present invention. In the figure, $V_{TG}$ denotes a pulse voltage waveform appearing on the pulse input line 37, $V_{TC}$ a pulse voltage waveform on the pulse input line 38, and $V_{TB}$ a pulse voltage waveform on the pulse input line 311. FIG. 4b illustrates operation modes in terms of potentials at the respective portions at the times shown in FIG. 4a. In the figure, L denotes the transmission line 35, N the storage portions and BCCD the horizontal shift registers 312. The potentials at the respective portions are represented by $V_L$, $V_N$, $V_N'$ and $V_B$, respectively. The electrodes of the input lines are represented by $T_G$, $T_C$ and $T_B$, respectively. The potentials at the respective portions at $t=0$ in the dark are denoted as $V_L$, $V_N$ and $V_B$, respectively. When the scanning pulse derived from the vertical shift register 34 at a time ($0 < t < t_1$) is applied to the vertical MOS switch 32, most of signal charge $Q_S$ stored in the photodiode 31 is transferred to the vertical transfer line 35, since the capacitance $C_L$ of the transfer line 35 is sufficiently large compared with the photo diode capacitance. To transfer the signal charge $Q_S$ transferred onto the vertical transfer line 35 to the storage portions N, pulses $V_{TG}$ and $V_{TC}$ are applied to the electrodes $T_G$ and $T_C$. The capacitance $C_N$ of the storage portion N are expressed by $C_0 + C_{pn}$, where $C_0$ represents a capacitor of the storage capacitance element 39, and $C_{pn}$ represents a stray capacitor at the drain portion of the MOS transistor 36. Firstly, bias charge $Q_b$ ($\propto V_L - V_N$) is effectively injected from the storage portion N at the potential $V_N$ into the vertical line 35 by the pulse $V_{TG}$ applied to the gate $T_G$ at time $t_1$. At time $t_2$, the pulse $V_{TC}$ is applied to the electrode $T_C$ to sufficiently increase the potential at the storage portion N to $V_N'$. At this time, the charge combined $(Q_S + Q_b)$ on the transfer line 35 is transferred into the storage portion N in a BBD mode. Here, $V_N' = V_N + C_0/(C_0 + C_{pn}) \times V_{TC}$. For transferring the combined charge from the transfer line L to the storage portion N, the potential at the portion N must be kept higher than the $V_L$, during the time that the combined charge $(Q_S + Q_b)$ is transferred to the storage portion N. At the same time, the potential on the vertical transfer line 35 is again set to the $V_L$. The set voltage $V_L$ is expressed by $V_L = V_{TG} - V_T^G$ where $V_T^G$ represents the threshold voltage of the gate $T_G$. Then, at time $t_3$, the $V_{TG}$ becomes zero. After electrically separating the transfer line 35 from the storage portion N, when the pulse $V_{TC}$ returns to a zero stage at time $t_4$, the potential at the storage portion N becomes small. When the transfer pulse $V_{TB}$ is applied to the gate $T_B$ at time $t_5$, only the signal charge $Q_S$ at the storage portion N is transferred to the horizontal shift register 312. At the same time, the potential at the storage portion N is again set to the $V_N$, so that the image pick-up device is ready for the next transfer cycle ($t_1$ to $t_6$). Here, $V_N = V_{TB} - V_T^B$ where $V_T^B$ is the threshold voltage of the gate $T_B$. In order to transfer the charge from the storage portion N to the horizontal shift register 5, the channel potential of the horizontal shift register 312 must be kept higher than the $V_N$. Actually, $V_T^G \approx V_T^B$. During one horizontal scanning period, the signal charge $Q_S$ transferred to the horizontal shift register 312 is transferred to the signal output section 313 where it is read out. A relation $V_L > V_N$ must be satisfied in order that the bias charge $Q_B$ is injected into the L portion at time $t_2$. The effective transfer efficiency of the signal charge $Q_S$ from the L portion to the N portion is extremely improved by the bias charge $Q_b$ automatically injected when the pulse $V_{TG}$ is applied earlier than the pulse $V_{TG}$. Such a transfer method will be referred to as a self-biased charge transfer.

When the phases of the pulse input voltages $V_{TG}$ and $V_{TC}$ are aligned in phase, no bias charge is injected and the charge transfer efficiency from the L portion to the N portion is poor. The result is that good picture is not formed. As seen from the potential diagrams shown in FIG. 4b, the injected charge is not transferred to the horizontal shift register. It is well known that, in the usual frame transfer CCD, the bias charge is externally injected to improve the transfer efficiency. In this method, however, the fixed pattern noise is caused due to a variation of the bias charge. On the other hand, such fixed pattern is never produced when the self-biased charge transfer method is used.

As described above, when those drive pulses are used, the signal charge derived from the vertical transfer line 35 of which the capacitor $C_L$ is large, for example, several tens, pF, may be transferred to the storage portion N with sufficiently small capacitor $C_N$ at high efficiency.

When the self-biased charge transfer method is used, the image is not damaged since the transfer efficiency is not deteriorated even at low illumination, so that a fairly clear picture may be formed. An experiment in which the capacitance of the storage portion N is several times the photodiode capacitor and $C_0 \sim C_{pn}$, which was conducted by the inventor(s), showed that the charge transfer efficiency reached 70% or more. $|t_{1-2}|$ was satisfactory with several tens of ns and each pulse width was approximately 1 $\mu$s.

In the above-mentioned operation, the signal charge transferred to the vertical transfer line 35 on only the first column is solely transferred to the horizontal shaft register 312. As a matter of fact, those operations are simultaneously executed for all the photodiodes on the same row. In the present invention, the respective photodiodes are commonly connected for each column through the drains of the vertical MOS switches 32 by the transfer lines 35. With this connection, a degree of the signal charge from the photodiodes arranged on other rows to the horizontal shift register 312 is independent of the relative distance to the horizontal shift register 312. Further, after the signal charge derived from the transfer line with large capacitance is transferred to the small capacitance element efficiently, it is transferred to the horizontal shift register 312. Therefore, the transfer efficiency is extremely improved, thus resulting in good vertical resolution, although the picture is hardly formed when it is directly transferred from the vertical transfer line 35 to the horizontal shift register.

Figure 5:
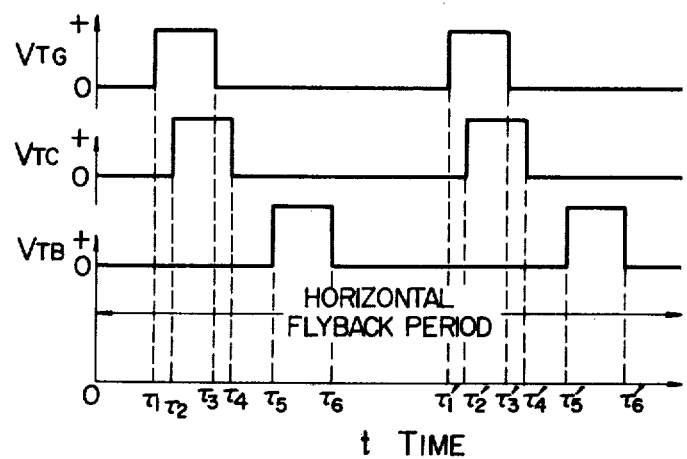
FIG. 5 shows a set of pulse waveforms for effecting a double transfer in order to improve the transfer efficiency.

Additionally, the present invention employs the charge coupled device for the horizontal shift register and three separate pulse input lines. When taking advantage of this feature, the charge transfer efficiency of the charge from the vertical transfer line to the horizontal shift register may be further improved. FIG. 5 shows timing diagrams useful in explaining the operation of such a case. The self-biased charge transfer pulses from $\tau_1$ to $\tau_6$ are similar to those in FIG. 4a. To repeat those pulses two times, the same pulses as those from $\tau_1$ to $\tau_6$ are used during a period from $\tau'_1$ to $\tau'_6$. The charge transfer method by those drive pulses will be called a double transfer. When the double transfer method, the transfer efficiency of the charge from the vertical transfer line 35 to the storage portion N is expressed by $\eta_2 = \eta + (1-\eta)\eta$, where $\eta$ is the transfer efficiency from the vertical transfer line 35 to the storage N when the pulse drive shown in FIG. 4a is used. Since the capacitance of the storage capacitor N is very small, the transfer efficiency from the storage portion N to the horizontal register 312 may be considered to be almost 100%. Accordingly, the transfer efficiency from the vertical transfer line 35 to the storage portion N may be considered to be that from the vertical transfer line 35 to the horizontal register 312.

When the double transfer method is used for $\eta = 70\%$, $\eta_2 = 91\%$. When it is used for $\eta = 90\%$, $\eta_2 = 99\%$. By using the double transfer, the vertical resolution is further improved. Within the effective horizontal flyback period, the use of any number of self-biased charge transfer pulses is allowed. The pulse drive of the $V_{TB}$ may be made not in the pulsate manner but in the DC manner from $\tau_5$ to $\tau_6'$, as seen from its operation principle. Further, it may be operated as the DC bias over the entire period of time. In this case, the $V_N$ must be smaller than the minimum channel potential of the horizontal register.

The description of the operation thus far made relates to how the signal charge on the transfer lines 35 is transferred to the horizontal shift register 312 at high efficiency. However, since each transfer line 35 includes a number of drains of the vertical MOS switches 32, the dark current produced during one horizontal scanning period and the optical signal collected near the drains are stored and these pseudo-optical signals are mixed into the true optical signal charge. As a result, the S/N ratio is deteriorated.

Figure 6:
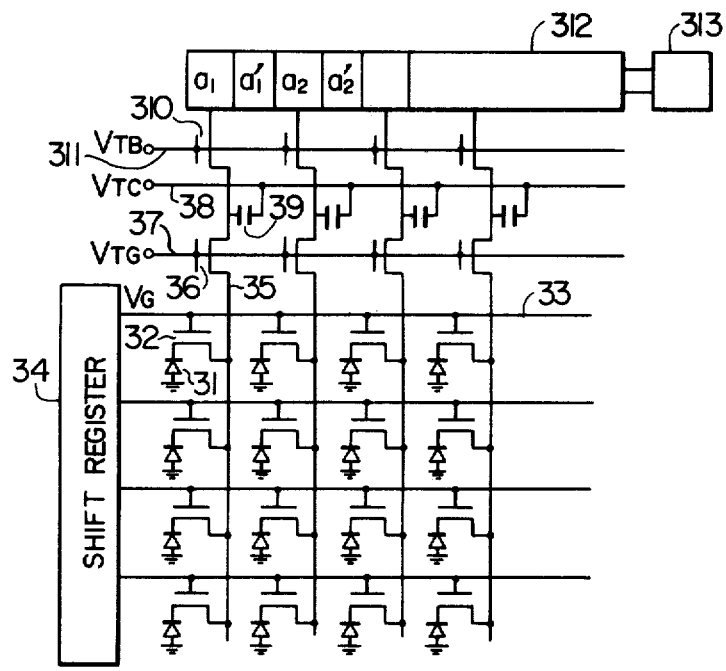
FIG. 6 shows a circuit arrangement of another embodiment of the present invention with a structure to clear a pseudo-optical signal.
Figure 7:
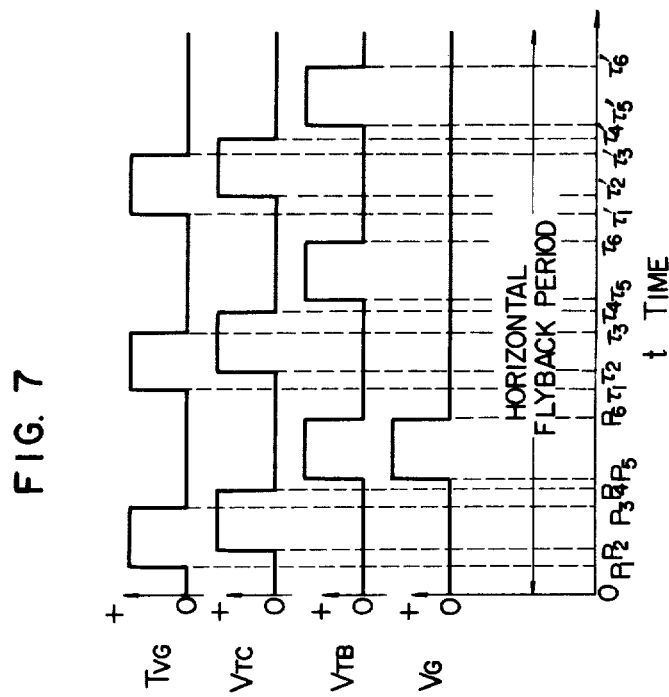
FIG. 7 shows an example of pulse timings for operating the two dimensional solid-state image pick-up device shown in FIG. 6.

The present invention may solve the above-mentioned problem. The description to follow is for the solid-state image pick-up device in which only true signal charge is transferred to the horizontal shift register 312 at high transfer efficiency by clearing the pseudo-optical signal on the transfer line 35 before the true signal charge is transferred to the storage portion N and for pulse timings when the image pick-up device operates. FIG. 6 shows a circuit diagram of the solid-state image pick-up device having a construction to clear the pseudo-optical signal. In the circuit arrangement shown in FIG. 3, the number of the unit bits of the horizontal shift register per vertical transfer line is double, having a unit bit structure $a_1$, $a_1'$, $a_2$, $a_2'$, .... The remaining portions of the circuit arrangement are similar to those shown in FIG. 3. Therefore, those remaining portions are designated by like symbols in FIG. 3. FIG. 7 shows pulse timing diagrams for driving the solid-state image pick-up device under discussion. Here, $V_G$ is a scanning pulse which is applied from the vertical MOS shift register 34 to the vertical MOS switch 32. In response to a train of pulses recurring from time $P_1$ to time $P_6$, the pseudo-optical signal on the vertical transfer line is transferred to a unit bit $a_1$ of the horizontal shift register in the self-biased transfer manner. Then, the pseudo-optical signal stored in the unit $a_1$ is transferred to an adjacent unit of the shift register bit $a_1'$ by using a proper transfer clock for the horizontal shift register during a period from $P_6$ to $\tau_6$, whereby the unit bit $a_1$ is emptied. Subsequently, only the true signal charge which is transferred from the photodiode to the transfer line by using the pulse $V_G$ applied at time $P_5$ is transferred to the unit bit $a_1$ of the horizontal shift register at high efficiency in the double transfer mode from time $\tau_1$ to $\tau'_6$. Then, during one horizontal scanning period, the pseudo-optical signal and the true signal charge are transferred by using the proper transfer clock through the horizontal shift register 312 to the output section 313 where it is read out. By erasing the pseudo-optical signal charge in proper method and reading only the true signal charge, a video signal with extremely high efficiency is obtained. In one of the methods for erasing the pseudo-optical signal, a couple of a sampling transfer gate and a drain are disposed adjacent to a proper bit of one or more of the horizontal shift register near the output section 313 to branch and discard the pseudo-optical signal charge. With such an arrangement, the pseudo-optical signal is erased by sampling the pseudo-optical signal into the drain in a manner that when the pseudo-optical signal is transferred to the unit bit, a pulse is applied to the sampling transfer gate.

In another method for erasing the pseudo-optical signal, the transfer gates are provided adjacent to a proper number of the effective unit bits of the horizontal shift register so that the pseudo-optical signal charge transferred to the horizontal shift register is outputted from the horizontal shift register through the transfer gates during the horizontal flyback period.

When this method is used, the noise contained in the video signal is reduced and the signal is easily processed. As described above, according to the present invention, the fixed pattern noise component caused by a variation of the dark current stored in a group of drains on the vertical transfer line is greatly decreased and a video signal of extremely high S/N ratio is obtainable. The exceeding saturated charge caused when the image pick-up device receives light exceeding the saturation light may be cleared when the method to clear the pseudo-optical signal is used, with the result that the blooming-resistive characteristic is extremely improved.

Figure 8:
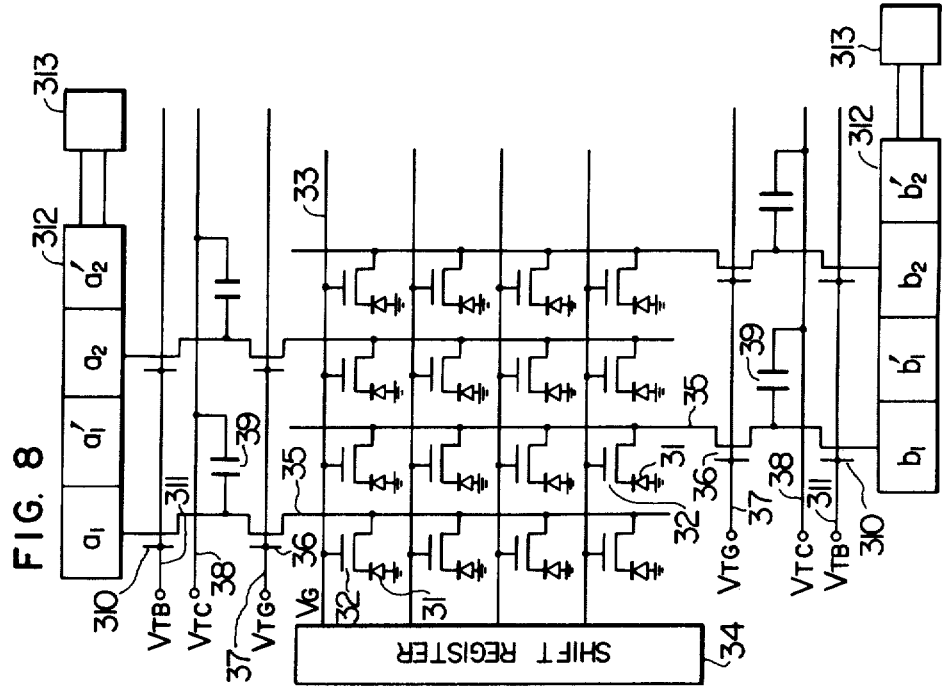
FIG. 8 shows a circuit diagram of yet another embodiment in which horizontal shift registers are arranged corresponding to odd and even columns of transmission lines on the upper and lower portions as viewed in the drawings.

For a case where a large number of the horizontal picture elements are used, the circuit for the solid-state image pick-up device may be arranged such that the horizontal shift registers are disposed on the upper and lower sides with relation to the odd and even columns of the vertical transfer lines whereby the transfer loss caused when the horizontal shift register operates at high speed is avoided and a density of the integration is improved. An example of such a circuit is illustrated in FIG. 8. Like reference numerals are used for designate like portions in FIG. 6. The drive pulse timings shown in FIG. 7 may be used in this example. While the above-mentioned embodiments use the transfer gates TG and TB of the surface channel type, those gates may be of the buried channel type. In this case, the transfer efficiency is further improved.

As described above, the present invention may completely eliminate the fixed pattern noise due to the horizontal scanning pulse which was hardly eliminated in the conventional MOS type solid-state image pick-up device. Further, the S/N ratio and the blooming resistive characteristics are greatly improved by clearing the pseudo-optical signal and the blooming charge. In the CCD type solid-state image pick-up device, the degree of deterioration of the vertical resolution caused by the multistage transfer of the signal charge changes depending on the distance of the picture elements relative to the horizontal shift register. This defect is overcome by the present invention. Further, there is no need for injecting an exterior bias charge in the present invention. Therefore, the solid-state image pick-up device of the present invention is free from the fixed pattern noise caused by the variation of the externally injected charges. Consequently, the solid-state image pick-up device of the present invention is greatly improved over conventional solid state image pick-up devices in resolution, S/N ratio, and blooming resistivity and the like. In this respect, the two dimensional solid-state image pick-up device of the invention is very useful when it used as a solid-state image pick-up device for single tip color camera.

What is claimed is:
1. A solid-state image pick-up device comprising:
   a plurality of photoelectric converting elements arranged in m-rows and n-columns;
   first signal charge transfer means including a vertical MOS-type shift register and a plurality of switch elements for simultaneously transferring optical signal charges stored in a row of said photoelectric converting elements onto a plurality of vertical transfer lines respectively associated with predetermined columns of photoelectric converting elements;
   a horizontal shift register for serially transferring therethrough optical signal charges and outputting said optical signal charges, said horizontal shift register being a charge coupled device;
   at least one second signal charge transfer means including transfer gates and storage capacitive elements for transferring the optical signal charges transferred to said vertical transfer lines to said horizontal shift register; and,
   a signal output device for outputting said optical signal charges transferred to and through said horizontal shift register.

2. A solid-state image pick-up device according to claim 1, wherein said second signal charge means including the transfer gates and the storage capacitive elements is comprised of storage capacitive elements with smaller capacitance than that of vertical transfer line capacitors which each receive at one electrode a first pulse voltage with the other electrode serving as the storage portion, first transfer gates for transferring charge between said storage portions and said vertical transfer lines in response to a second pulse voltage, and second transfer gates for transferring charge from said storage portions to said horizontal shift register.

3. A solid-state image pick-up device according to claim 2, wherein the phase of a pulse voltage applied to said first transfer gates is set earlier than that of a pulse voltage applied to the one electrode of said storage capacitive elements, said transfer means including the first transfer gates and storage capacitive elements performing at least one sequence of operations during a given transfer period, said sequence of operations including a first operation of injecting bias charge from said storage capacitive element to said vertical lines, a second operation of transferring a changed amount of the charge on said vertical transfer line to said storage capacitive element, and a third operation of transferring only said changed amount of the charge to said horizontal shift register.

4. A solid-state image pick-up device according to claim 1, wherein said horizontal shift register includes a pair of unit elements for each of said vertical transfer lines, each of said vertical transfer lines loading optical signal charges thereon into one of said pair of unit elements, the other of said pair of unit elements receiving optical signal charges from said one unit element of said pair, so that true optical signal charges and pseudo-optical charges are stored in adjacent unit elements of each pair.

5. A solid-state image pick-up device according to claim 4, wherein said horizontal shift register has at least one transfer gate for branching and transferring the charge from an effective unit element, said horizontal shift register outputting charges other than the true optical signal charges through said transfer gate to prevent said pseudo-optical charges from reaching said signal output device.

6. A solid-state image pick-up device according to claim 5, wherein said transfer gates for branching and transferring charge are provided corresponding to odd and even columns of said vertical transfer lines, respectively.

7. A solid-state image pick-up device according to claim 1, further comprising a pair of said second signal charge transfer means, each being separately provided respectively for the odd and even columns of said vertical transfer lines.

8. A charge transfer method for solid-state image pick-up device comprising the steps of transferring only a changed amount of charge stored in a first capacitive element associated with a vertical charge transfer line of said device to a second capacitive element having a smaller capacitance than that of said first capacitive element, and providing a third capacitive element in the charge transfer path from said first capacitive element to said second capacitive element and operating the same to inject charge into said first capacitive element.

9. A charge transfer method for a solid-state image pick-up device according to claim 8, further comprising a first step of injecting a fixed amount of bias charge from said third capacitive element into said first capacitive element, a second step of transferring charge from said first capacitive element to said third capacitive element, and a third step of transferring an amount of charge corresponding to the changed amount of the charge stored in said first capacitive element from said third capacitive element to said second capacitive element while the charge substantially equal to said bias charge amount remains in said third capacitive element.

10. A charge transfer method for a solid-state image pick-up device according to claim 9, wherein said sequence of operations are repeated several times during a given transfer period.

* * * * *